United States Patent
Lin

(10) Patent No.: US 9,299,414 B1
(45) Date of Patent: Mar. 29, 2016

(54) DEVICES FOR SELF-REFRESHING MEMORIES, AND METHODS THEREOF

(71) Applicant: Winbond Electronics Corp., Taichung (TW)

(72) Inventor: Che-Min Lin, New Taipei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/505,359

(22) Filed: Oct. 2, 2014

(51) Int. Cl.
*G11C 11/406* (2006.01)
*G11C 11/4096* (2006.01)

(52) U.S. Cl.
CPC ...... *G11C 11/40615* (2013.01); *G11C 11/4096* (2013.01)

(58) Field of Classification Search
CPC .. G11C 11/401; G11C 11/402; G11C 11/403; G11C 11/40615; G11C 11/4085; G11C 11/4096; G11C 11/406
USPC .............................................. 365/222, 189.2
See application file for complete search history.

(56) References Cited

U.S. PATENT DOCUMENTS

| | | | | |
|---|---|---|---|---|
| 6,256,244 B1 * | 7/2001 | Kim | ...................... | G11C 11/406 365/203 |
| 2013/0051171 A1 * | 2/2013 | Porter | ...................... | G11C 8/08 365/222 |

* cited by examiner

*Primary Examiner* — Thao H Bui
*Assistant Examiner* — Alfredo Bermudez Lozada
(74) *Attorney, Agent, or Firm* — Muncy, Geissler, Olds & Lowe, P.C.

(57) ABSTRACT

A self-refresh device, adopted in a memory array including a plurality of memory cells, includes a first word-line selecting module, which is enabled according to a first main-word-line signal, and a self-refresh controller. The first word-line selecting module includes a first selecting device, which selects a first word line according to a first word-line driving signal, and a second selecting device, which selects a second word line according to a second word-line driving signal. The self-refresh controller generates the first word-line driving signal, the second word-line driving signal, and the first main word-line signal to select one of the memory cells corresponding to the selected one of the first word line and the second word line for self-refreshing. When the first word line switches to the second word line, the self-refresh controller maintains the first main word-line signal at the same logic level.

8 Claims, 4 Drawing Sheets

DEVICES FOR SELF-REFRESHING MEMORIES, AND METHODS THEREOF

BACKGROUND OF THE INVENTION

1. Field of the Invention

The disclosure relates generally to methods and devices for the self-refreshing of memory, and more particularly to methods and devices for memory self-refreshing to effectively reduce standby current.

2. Description of the Related Art

In Dynamic Random Access Memory, the storage unit includes a transistor and a capacitor to store the data of a bit. Since there are various leakage paths surrounding the capacitor, the storage unit has to periodically refresh the stored data in the standby mode. That is the reason that it is called "dynamic."

The current consumption in the standby mode is one of the most important technical indexes of DRAM; however, most conventional ways to reduce the current consumption in a standby mode emphasize reducing quiescent current consumption to remarkable success. On the other hand, the current consumption of DRAM self-refreshing is also consumed in the standby mode. Therefore, it is necessary to reduce the current consumption of self-refreshing to achieve the goal of saving the power of DRAM.

BRIEF SUMMARY OF THE INVENTION

For solving the above problems, the invention provides a machine authentication device and method for quickly processing authentication and setting. The invention further integrates machines of various transmission types and makes accessing data between machines easier.

An embodiment of a memory self-refresh device adapted in a memory array which comprises a plurality of memory cells comprises a first word-line selecting module, a bit-line sense amplifier, and a self-refresh controller. The first word-line selecting module is enabled by a first main word-line signal, which comprises a first selecting device and a second selecting device. The first selecting device selects a first word line according to a first word-line driving signal. The second selecting device selects a second word line according to a second word-line driving signal. The bit-line sense amplifier self-refreshes one of the memory cells corresponding to a selected the first word line or second word line according to a refresh signal. The self-refresh controller generates the first word-line driving signal, the second word-line driving signal, the first main word-line signal, and the refresh signal to self-refresh the memory cell corresponding to a selected one of the first word line and the second word line, in which the self-refresh controller maintains the first main word-line at the same logic level when the first word line is switching to the second word line.

An embodiment of a memory self-refresh device further comprises a second word-line selecting module. The second word-line selecting module receives a second main word-line signal, which comprises a third selecting device and a fourth selecting device. The third selecting device selects a third word line according to the first word-line driving signal. The fourth selecting device selects a fourth word line according to the second word-line driving signal. When the second word line is switching to the third word line, the self-refresh controller stops generating the first main word-line signal and the second word-line driving signal, sequentially generates the second main word-line signal and the first word-line driving signal, and maintains the second main word-line signal at the same logic level when the third word line switching to the fourth word line.

In an embodiment of a memory self-refresh device, the first selecting device is a first inverter, the first inverter comprises a first supply source terminal, a first input terminal, and a first output terminal, and the first word-line driving signal is applied to the first inverter by the first input terminal, such that the first inverter selects the first word line by the first output terminal, in which the second selecting device is a second inverter, the second inverter comprises a second supply source terminal, a second input terminal, and a second output terminal, the second word-line driving signal is applied to the second inverter by the second supply source terminal, and the first main word-line signal selects the second inverter by the second input terminal, such that the second inverter selects the second word line by the second output terminal.

An embodiment of a memory self-refresh device further comprises a command decoder, which generates an enable signal. The self-refresh controller generates the first word-line driving signal, the second word-line driving signal, the first main word-line signal, and the refresh signal according to the enable signal.

In an embodiment of a memory self-refresh device, the self-refresh controller further comprises a self-refresh controlling module, a self-refresh timer module, and a self-refresh counting module. The self-refresh controlling module sequentially generates the first word-line driving signal and the second word-line driving signal according to the enable signal and a self-refresh signal, and generates a state signal and the refresh signal. The self-refresh timer module receives the state signal and generates a time signal by controlling a time interval between the first word-line driving signal and the second word-line driving signal. The self-refresh counting module generates the self-refresh signal and the first main word-line signal according to the time signal, and maintains the first main word-line signal at the same logic level before the second word-line driving signal switches to the first word-line driving signal.

In an embodiment of a memory self-refresh method adapted in a memory array which comprises a plurality of memory cells, comprises: enabling a first word-line selecting module according to a main word-line signal and sequentially selecting a first word line and a second word line; and self-refreshing one of the memory cells corresponding to a selected one of the first word line and the second word line, wherein the first main word-line is maintained at the same logic level when the first word line switching to the second word line.

In an embodiment of a memory self-refresh method, further comprises: enabling a second word-line selecting module according to a second main word-line signal and sequentially selecting a third word line and a fourth word line; and self-refreshing one of the memory cells corresponding to the selected one of the third word line and the fourth word line, wherein the second main word-line signal is maintained at the same logic level when the third word line switching to the fourth word line.

In an embodiment of a memory self-refresh method, the first selecting device is a first inverter, the first inverter comprises a first supply source terminal, a first input terminal, and a first output terminal, and the first word-line driving signal is applied to the first inverter by the first input terminal, such that the first inverter selects the first word line by the first output terminal, wherein the second selecting device is a second inverter, the second inverter comprises a second supply source terminal, a second input terminal, and a second output terminal, the second word-line driving signal is applied to the second inverter by the second supply source terminal, and the first main word-line signal selects the second inverter by the second input terminal, such that the second inverter selects the second word line by the second output terminal.

In an embodiment of a memory self-refresh method, further comprises: generating the first word-line driving signal, the second word-line driving signal, the first main word-line signal, and the refresh signal according to an enable signal generated by a command decoder.

In an embodiment of a memory self-refresh method further comprises: sequentially generating the first word-line driving signal and the second word-line driving signal according to the enable signal and a self-refresh signal and generating a state signal and the refresh signal; generating a time signal by controlling a time interval between the first word-line driving signal and the second word-line driving signal according to the state signal; and generating the self-refresh signal and the first main word-line signal according to the time signal, wherein the first main word-line signal is maintained at the same logic level before the second word-line driving signal switching to the first word-line driving signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
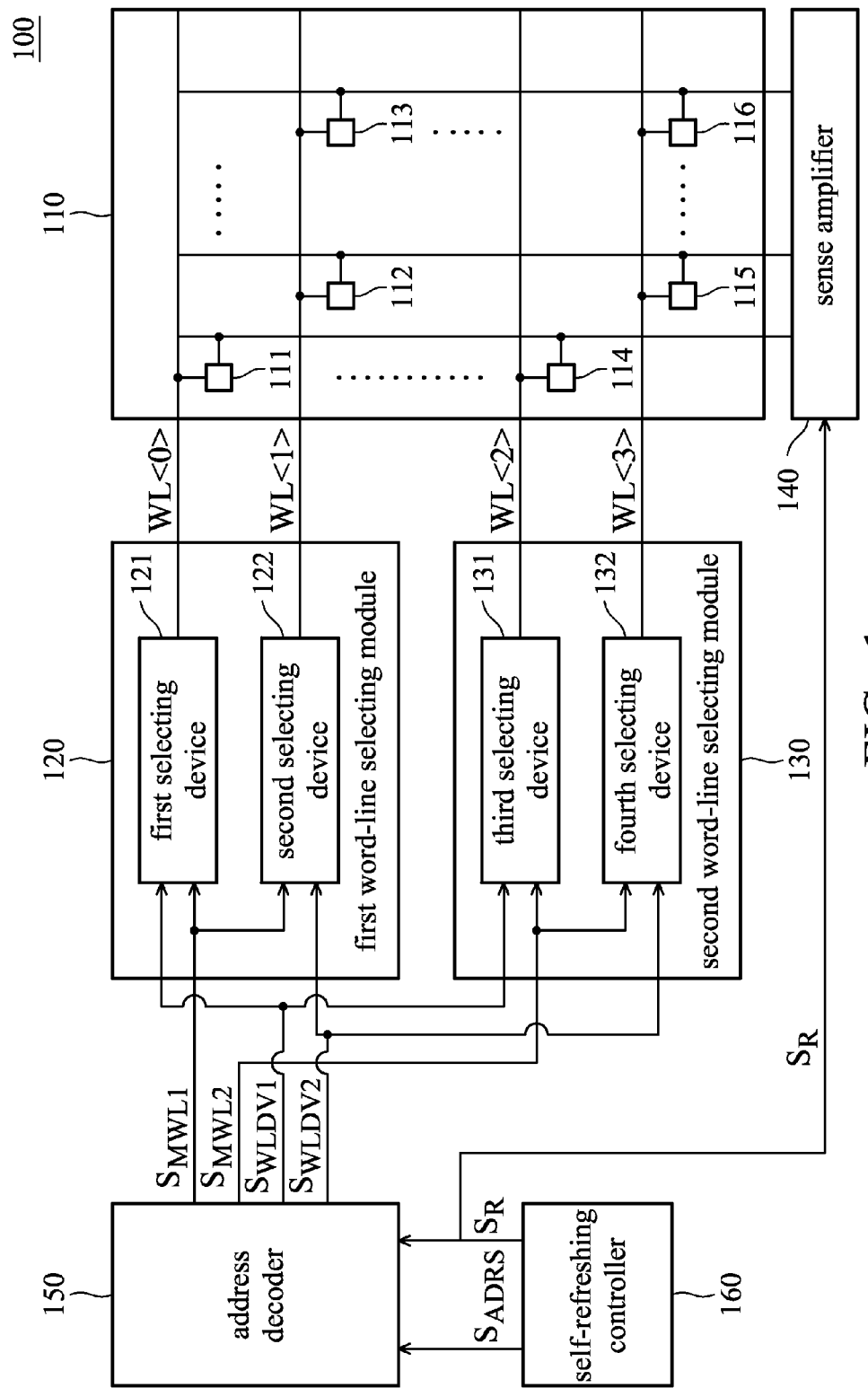
FIG. 1 is a block diagram of a memory self-refreshing device in accordance with an embodiment of the invention.

FIG. 1 is a block diagram of a memory self-refreshing device in accordance with an embodiment of the invention. As shown in FIG. 1, the memory self-refreshing device 100 includes the memory array 110, the first word-line selecting module 120, the second word-line selecting module 130, the sense amplifier 140, the address decoder 150, and the self-refreshing controller 160. The memory array 110 includes a plurality of memory cells 111~116 which are respectively coupled to the first word line WL<0>, the second word line WL<1>, the third word line WL<2>, and the fourth word line WL<3>.

The first word-line selecting module 120 includes the first selecting device 121 and the second selecting device 122. The second word-line selecting module 130 includes the third selecting device 131 and the fourth selecting device 132. The self-refreshing controller 160 enables the address decoder 150 by the refresh signal $S_R$. The address decoder 150, according to the address refreshed signal $S_{ADRS}$ generated by the self-refreshing controller 160, enables the first word-line selecting module 120 by the first main word-line signal $S_{MWL1}$ and then enables the first selecting device 121 to select the first word line WL<0> by the first word-line driving signal $S_{WLDV1}$, or enables the second selecting device 122 to select the second word line WL<1> by the second word-line driving signal $S_{WLDV2}$.

The address decoder 150 further enables the second word-line selecting module 130 by the second main word-line signal $S_{MWL2}$, and then enables the third selecting device 131 to select the third word line WL<2> by the first word-line driving signal $S_{WLDV1}$, or enables the fourth selecting device 132 to select the fourth word line WL<3> by the second word-line driving signal $S_{WLDV2}$.

The bit-line sense amplifier 140, according to the refresh signal $S_R$ generated by the self-refresh controller 160, performs the self-refresh action for one of the memory cells 111~116 which is selected by the first word line WL<0>, the second word line WL<1>, the third word line WL<2>, or the fourth word line WL<3>.

The address decoder 150, according to the address refreshed signal $S_{ADRS}$ generated by the self-refresh controller 160, generates the first main word-line signal $S_{MWL1}$, the first word-line driving signal $S_{WLDV1}$, the second word-line driving signal $S_{WLDV2}$, and the second word-line driving signal $S_{MWL2}$ to control the self-refresh sequence of the memory cells 111~116 respectively, and controls the bit-line sense amplifier 140 to perform the self-refresh action by the refresh signal $S_R$. Moreover, when the first word line WL<0> switches to the second word line WL<1>, the self-refresh controller 160 controls the address decoder 150 to keep the first main word line signal $S_{MWL1}$ in the same logic level for reducing the power consumption of charging and discharging the first main word-line signal $S_{MWL1}$ and to further reduce the standby current of the standby mode.

Similarly, when the third word line WL<2> switching to the fourth word line WL<3>, the self-refresh controller 160 controls the address decoder 150 to maintain the second main word-line signal $S_{MWL2}$ at the same logic level. According to another embodiment of the invention, when the second word line WL<1> switching to the third word line WL<2>, the self-refresh controller 160 controls the address decoder 150 to stop generating the first main word-line signal $S_{MWL1}$ and the second word-line driving signal $S_{WLDV2}$, and sequentially generates the second main word-line signal $S_{MWL2}$ and the first word-line driving signal $S_{WLDV1}$.

According to another embodiment of the invention, the self-refresh controller 160 could directly generate the first main word-line signal $S_{MWL1}$, the second word-line driving signal $S_{WLDV2}$, the first main word-line signal $S_{MWL1}$, and the second main word-line signal $S_{MWL2}$ to control the self-refresh order of the memory cells 111~116 without decoding the address refreshed signal $S_{ADRS}$ by the address decoder 150.

Figure 2:
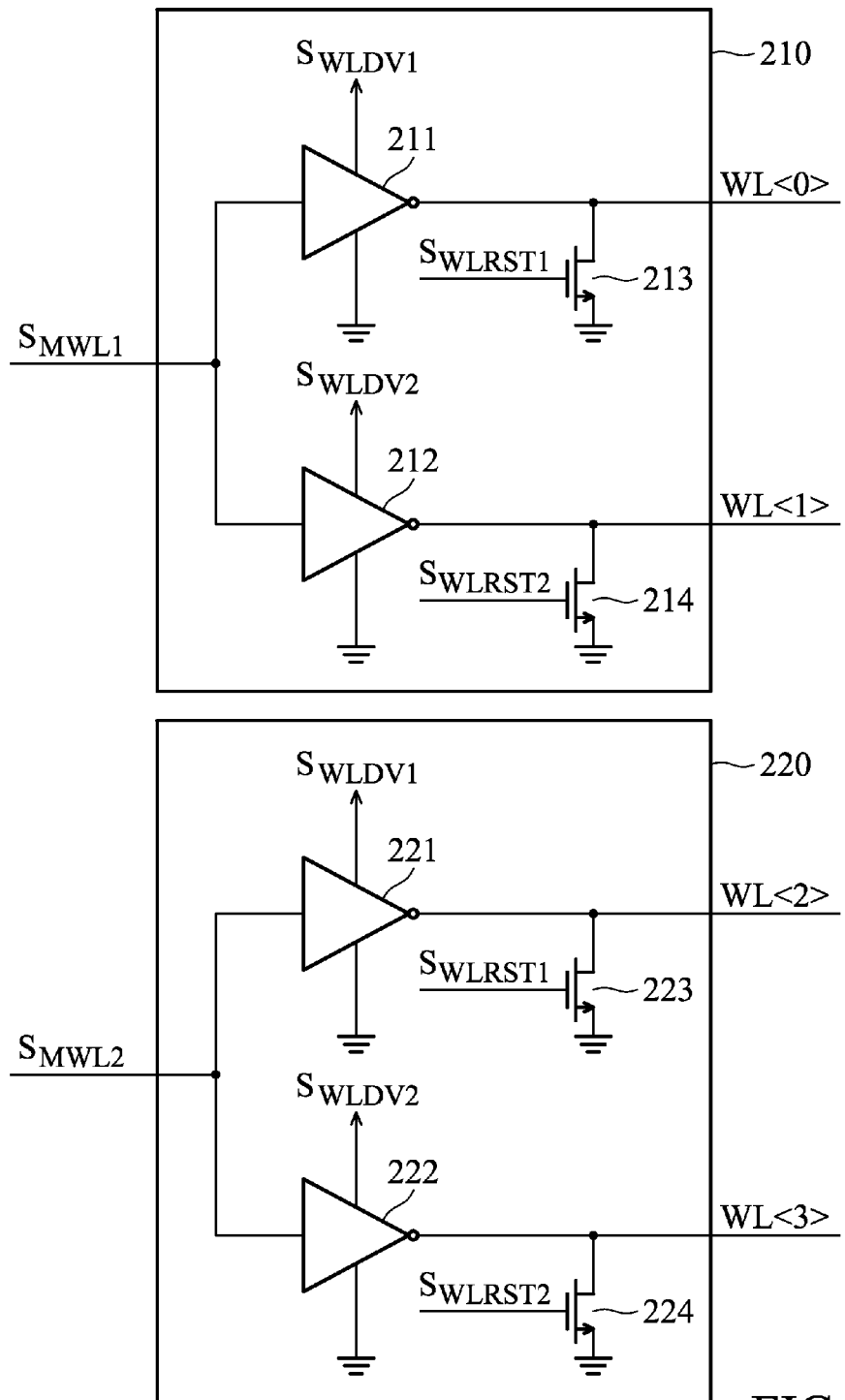
FIG. 2 is a schematic of the first word-line selecting module and the second word-line selecting module in accordance with an embodiment of the invention.

FIG. 2 is a schematic of the first word-line selecting module and the second word-line selecting module in accordance with an embodiment of the invention. As shown in FIG. 2, the first word-line selecting module 210 and the first word-line selecting module 120 of FIG. 1 are the same, and the second word-line selecting module 220 and the second word-line selecting module 130 of FIG. 1 are the same.

According to an embodiment of the invention, the first selecting device 121, the second selecting device 122, the third selecting device 131, and the fourth selecting device 132 of FIG. 1 are inverters. Therefore, the first selecting device 121 of FIG. 1 corresponds to the first inverter 211, the second selecting device 122 of FIG. 1 corresponds to the second inverter 212, the third selecting device 131 of FIG. 1 is corresponding to the third inverter 221, and the fourth selecting device 132 of FIG. 1 is corresponding to the fourth inverter 222.

As shown in FIG. 2, the supply source terminals of the first inverter 211 and the third inverter 221 are both coupled to the first word-line driving signal $S_{WLDV1}$, and the input terminals of the first inverter 211 and the second inverter 212 are both coupled to the first main word-line signal $S_{MWL1}$. When the first inverter 211 selects the first word line WL<0>, the first word-line driving signal $S_{WLDV1}$ is at a high logic level and the first main word-line signal $S_{MWL1}$ is at a low logic level, such that the first word line WL<0> enters a high logic level. That is, the memory cell 111 of FIG. 1 is selected to perform a self-refresh action.

Since the self-refresh controller 160 could control the order of the selected word lines when performing a self-refresh, according to an embodiment of the invention, the memory cells 111~116 correspond to the order of the first word line WL<0>, the second word line WL<1>, the third word line WL<2>, and the fourth word line WL<3>.

When the first word line WL<0> switching to the second word line WL<1>, the first main word-line signal $S_{MWL1}$ remains at the same low logic level, the first word-line driving signal $S_{WLDV1}$ is converted from a high logic level to a low logic level, and the second word line driving signal $S_{WLDV2}$ is converted from low logic level to high logic level. When the first word-line driving signal $S_{WLDV1}$ is at a low logic level, the first word line WL<0> is converted to low logic level by the first N-type transistor 213 which is controlled by the first word-line reset signal $S_{WLRST1}$. The second word line WL<1> is also selected by the second word-line driving signal $S_{WLDV2}$ to be at a high logic level.

In addition, when deselecting the second word line WL<1>, the third word line WL<2>, and the fourth word line WL<3>, the second N-type transistor 214, the third N-type transistor 223, and the fourth N-type transistor 224 respectively pull down the second word line WL<1>, the third word line WL<2>, and the fourth word line WL<3> to a low logic level.

When the second word line WL<1> switching to the third word line WL<2>, the self-refresh controller 160 of FIG. 1 controls the address decoder 150 to convert the first main word-line signal $S_{MWL1}$ to high logic level, convert the second main word-line signal $S_{MWL2}$ to low logic level, and select the third word line WL<2> by the first word-line driving signal $S_{WLDV1}$ being high logic level. The second word line WL<1> is also deselected by the second N-type transistor 214 controlled by the second word-line reset signal $S_{WLRST2}$.

Similarly, when the third word line WL<2> switching to the fourth word line WL<3>, the second main word-line signal $S_{MWL2}$ remains the same low logic level, the first word-line driving signal $S_{WLDV1}$ is converted from high logic level to low logic level, and the second word line driving signal $S_{WLDV2}$ is converted from low logic level to high logic level. The third word line WL<2> is pulled down to low logic level by the third N-type transistor 223 controlled by the first word-line reset signal $S_{WLRST1}$.

When deselecting the fourth word line WL<3>, the fourth N-type transistor 224, which is also controlled by the second word-line reset signal $S_{WLRST2}$, pulls down the fourth word line WL<3> to low logic level. According to an embodiment of the invention, the first word-line reset signal $S_{WLRST1}$ is an out-phase signal of the first word-line driving signal $S_{WLDV1}$, and the second word-line reset signal $S_{WLRST2}$ is an out-phase signal of the second word-line driving signal $S_{WLDV2}$.

Figure 3:
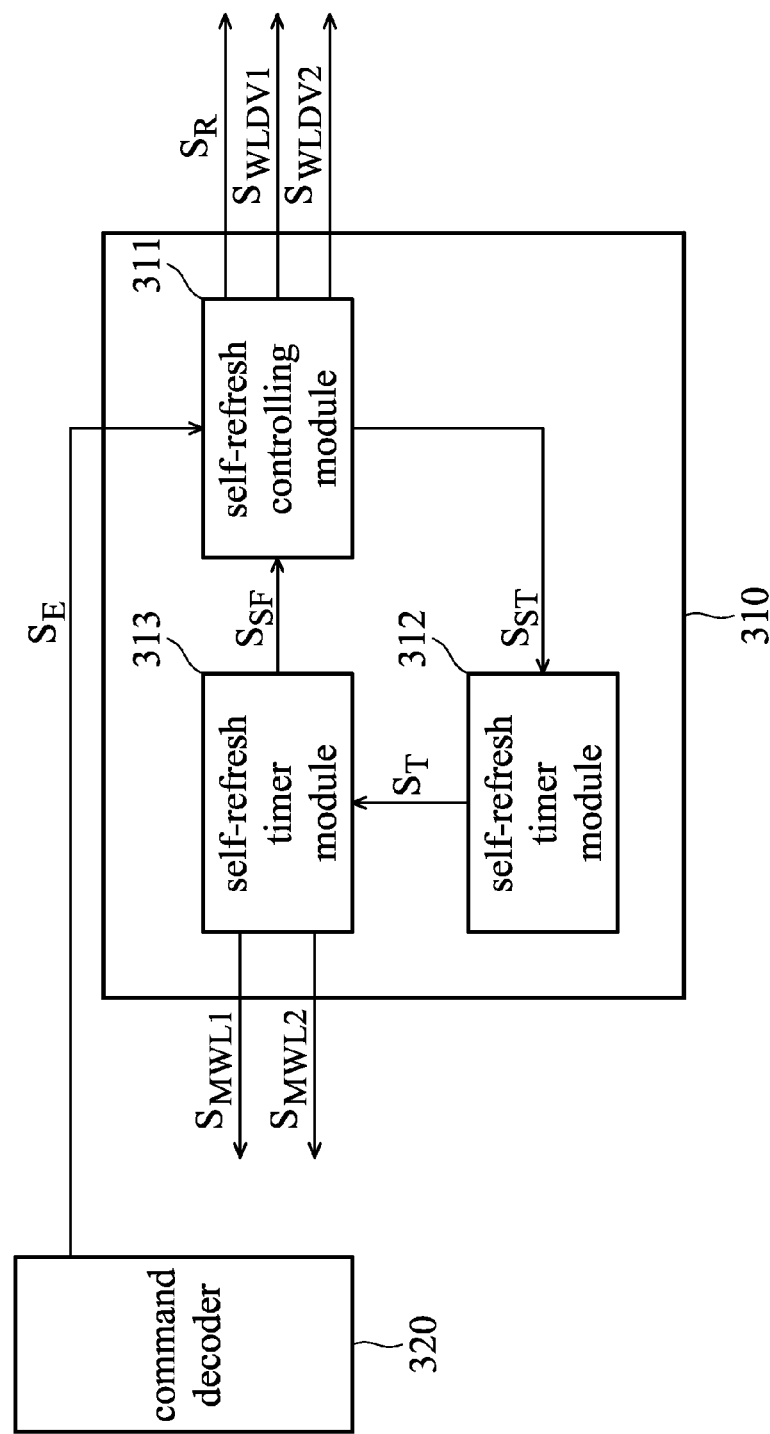
FIG. 3 is a block diagram of the self-refresh controller in accordance with an embodiment of the invention.

FIG. 3 is a block diagram of the self-refresh controller in accordance with an embodiment of the invention. As shown in FIG. 3, the self-refresh controller 310 and the self-refresh controller 160 are the same, and the self-refresh controller 310 receives the enable signal $S_E$ of the command decoder 320 to perform self-refresh. According to an embodiment of the invention, the user programs the command decoder 320 to set up the related parameters and process the self-refresh.

As shown in FIG. 3, the self-refresh controller 310 includes the self-refresh controlling module 311, the self-refresh timer module 312, and the self-refresh timer module 313. The self-refresh controlling module 311 generates the self-refresh signal $S_{SF}$, according to the enable signal $S_E$ generated by the command decoder 320 and the self-refresh signal $S_{SF}$ generated by the self-refresh counting module 313, to sequentially generate the first word-line driving signal $S_{WLDV1}$, the second word-line driving module $S_{WLDV2}$, the refresh signal $S_R$, and the state signal $S_{ST}$. As shown in FIG. 1, the refresh signal $S_R$ is configured to enable the bit-line sense amplifier 140 to perform self-refreshing on the memory cells 111~116 selected by a combination of the first word-line driving signal $S_{WLDV1}$, the second word-line driving signal $S_{WLDV2}$, the first main word-line signal $S_{MWL1}$, and the second main word-line signal $S_{MWL1}$, and to control the timing of generating the first word-line driving signal $S_{WLDV1}$ and the second word-line driving signal $S_{WLDV2}$. According to an embodiment of the invention, the first word-line driving signal $S_{WLDV1}$ and the second word-line driving signal $S_{WLDV2}$ maintain high logic level for 30 nsec, and then immediately convert to low logic level.

After the self-refresh timer module 312 receives the state signal $S_{ST}$ generated by the self-refresh control module 311, the self-refresh timer module 312 counts a length of time and then generates the time signal $S_T$ to control the time interval between the first word-line driving signal $S_{WLDV1}$ and the second word-line driving signal $S_{WLDV2}$. According to an embodiment of the invention, the time interval between the first word-line driving signal $S_{WLDV1}$ and the second word-line driving signal $S_{WLDV2}$ is 7.8 μsec.

The self-refresh counting module 313 is configured to sequentially select each word line of the memory array. The self-refresh counting module 313 receives the time signal $S_T$ to generate the self-refresh signal $S_{SF}$ for controlling the self-refresh controlling module 311 to generate the time interval between the first word-line driving signal $S_{WLDV1}$ and the second word-line driving signal $S_{WLDV2}$.

At the same time, the self-refresh counting module 313 further generates the first main word-line signal $S_{MWL1}$ and the second main word-line signal $S_{MWL1}$ according to the recorded memory addresses that have been self-refreshed. Before the first word-line driving signal $S_{WLDV1}$ and the second word-line driving signal $S_{WLDV2}$ complete a cycle, the first main word-line signal $S_{MWL1}$ and the second main word-line signal $S_{MWL2}$ remain at the same logic level. According to an embodiment of the invention, self-refreshing the memory array must be accomplished within 64 msec.

According to an embodiment of the invention, when having the first word-line driving signal $S_{WLDV1}$ and the second word-line driving signal $S_{WLDV2}$ and before the second word-line driving signal $S_{WLDV2}$ switching to the first word-line driving signal $S_{WLDV1}$, the first main word-line signal $S_{MWL1}$ and the second main word-line signal $S_{MWL2}$ are remained at the same logic level. When the second word-line driving signal $S_{WLDV2}$ switching to the first word-line driving signal $S_{WLDV1}$, one of the first main word-line signal $S_{MWL1}$ and the second main word-line signal $S_{MWL2}$ is cleaned up to generate the other of the first main word-line signal $S_{MWL1}$ and the second main word-line signal $S_{MWL1}$ for selecting the next word line.

According to another embodiment of the invention, the self-refresh controller 310 generates the refreshed address signal $S_{ADRS}$ to the address decoder (not shown in FIG. 3), and the refreshed address signal $S_{ADRS}$ is converted to the first word-line driving signal $S_{WLDV1}$, the second word-line driving signal $S_{WLDV2}$, the first main word-line signal $S_{MWL1}$ and the second main word-line signal $S_{MWL2}$. Before the first word-line driving signal $S_{WLDV1}$ and the second word-line driving signal $S_{WLDV2}$ complete a cycle, the self-refresh controller 310 keeps the first main word-line signal $S_{MWL1}$ and the second main word-line signal $S_{MWL2}$ at the same logic level.

Figure 4:
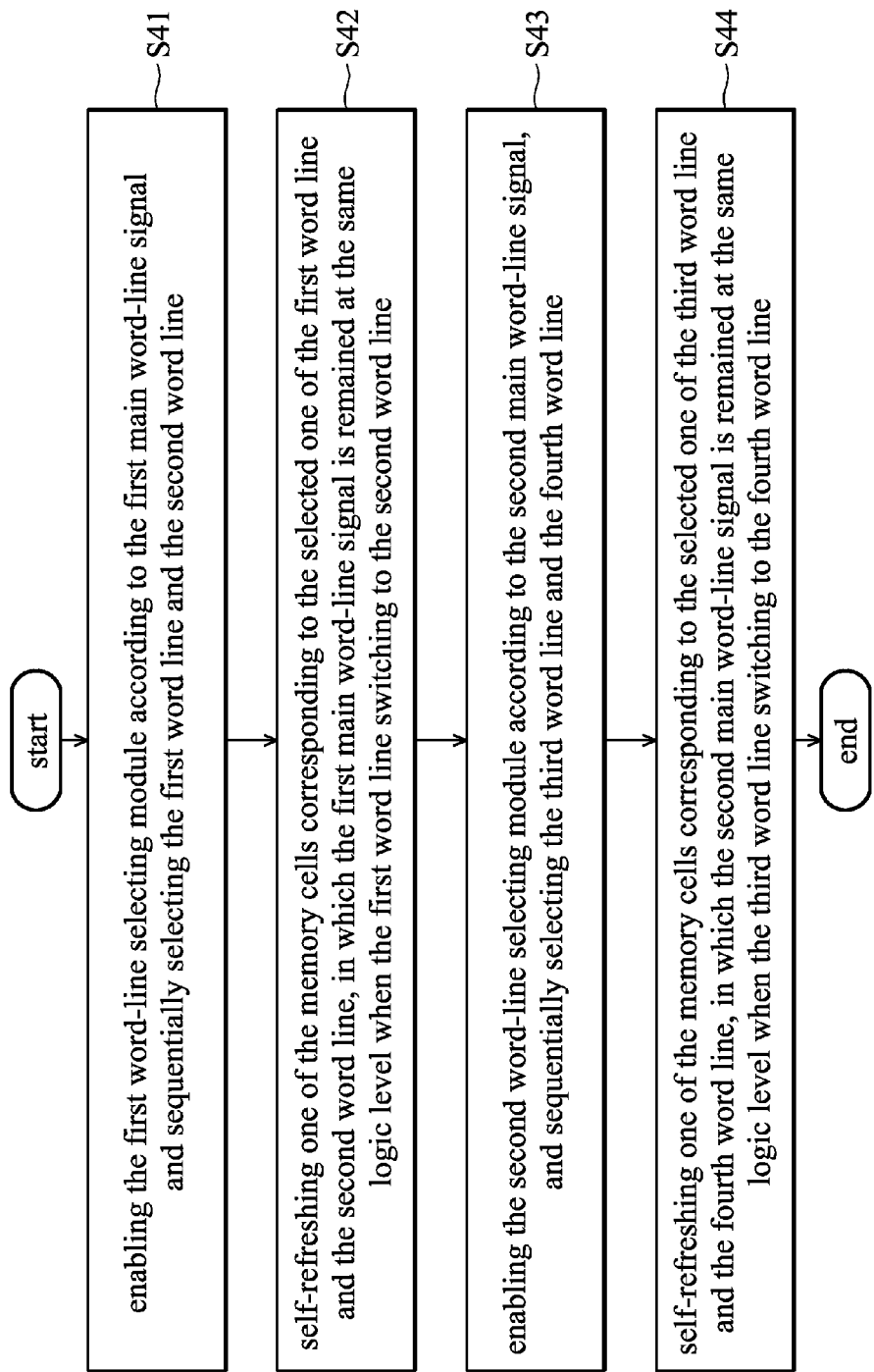
FIG. 4 is a flow chart of the memory self-refreshing method in accordance with an embodiment of the invention.

FIG. 4 is a flow chart of the memory self-refreshing method in accordance with an embodiment of the invention. The following flow chart of FIG. 4 will be described in detail with reference to the block diagram of FIG. 1.

At the beginning, the first word-line selecting module 120 is enabled according to the first main word-line signal $S_{MWL1}$, and the first word line WL<0> and the second word line WL<1> are sequentially selected (Step S41).

One of the memory cells 111~113 corresponding to the selected one of the first word line WL<0> and the second word line WL<1> is self-refreshed, in which the first main word-line signal $S_{MWL1}$ is remained at the same logic level when the first word line switching to the second word line WL<1> (Step S42).

The second word-line selecting module 130 is enabled according to the second main word-line signal $S_{MWL2}$, and the third word line WL<2> and the fourth word line WL<3> are sequentially selected (Step S43).

One of the memory cells 114~116 corresponding to the selected one of the third word line WL<2> and the fourth word line WL<3> is self-refreshed, in which the second main word-line signal $S_{MWL2}$ is remained at the same logic level (Step S44).

The power consumption caused by switching the first main word-line signal $S_{MWL1}$ and the second main word-line signal $S_{MWL2}$ can be reduced by using the memory self-refresh devices and the memory self-refresh methods provided in the invention. The purpose of saving power can further be achieved by reducing the standby current when the DRAM is working in standby mode.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A memory self-refresh device, adapted in a memory array, wherein the memory array comprises a plurality of memory cells, comprising:
    a first word-line selecting module, enabled by a first main word-line signal, comprising:
        a first selecting device, selecting a first word line according to a first word-line driving signal; and
        a second selecting device, selecting a second word line according to a second word-line driving signal;
    a bit-line sense amplifier, self-refreshing one of the memory cells corresponding to a selected one of the first word line and the second word line according to a refresh signal; and
    a self-refresh controller, generating the first word-line driving signal, the second word-line driving signal, the first main word-line signal, and the refresh signal to self-refresh the one of the memory cells corresponding to a selected one of the first word line and the second word line, wherein the self-refresh controller maintains the first main word-line at the same logic level when the first word line switching to the second word line, wherein the self-refresh controller further comprises:
        a self-refresh controlling module, sequentially generating the first word-line driving signal and the second word-line driving signal according to an enable signal and a self-refresh signal, and generating a state signal and the refresh signal;
        a self-refresh timer module, receiving the state signal and generating a time signal by controlling a time interval between the first word-line driving signal and the second word-line driving signal; and
        a self-refresh counting module, generating the self-refresh signal and the first main word-line signal according to the time signal, and maintaining the first main word-line signal at the same logic level before the second word-line driving signal switching to the first word-line driving signal.

2. The memory self-refresh device of claim 1, further comprising:
    a second word-line selecting module, receiving a second main word-line signal, comprising:
        a third selecting device, selecting a third word line according to the first word-line driving signal; and
        a fourth selecting device, selecting a fourth word line according to the second word-line driving signal, wherein
        when the second word line switches to the third word line, the self-refresh controller stops generating the first main word-line signal and the second word-line driving signal, sequentially generates the second main word-line signal and the first word-line driving signal, and maintains the second main word-line signal at the same logic level when the third word line switching to the fourth word line.

3. The memory self-refresh device of claim 1, wherein the first selecting device is a first inverter, the first inverter comprises a first supply source terminal, a first input terminal, and a first output terminal, and the first word-line driving signal is applied to the first inverter by the first input terminal, such that the first inverter selects the first word line by the first output terminal, wherein the second selecting device is a second inverter, the second inverter comprises a second supply source terminal, a second input terminal, and a second output terminal, the second word-line driving signal is applied to the second inverter by the second supply source terminal, and the first main word-line signal selects the second inverter by the second input terminal, such that the second inverter selects the second word line by the second output terminal.

4. The memory self-refresh device of claim 3, further comprising:
    a command decoder, generating the enable signal, wherein the self-refresh controller generates the first word-line driving signal, the second word-line driving signal, the first main word-line signal, and the refresh signal according to the enable signal.

5. A memory self-refresh method, adapted in a memory array, wherein the memory array comprises a plurality of memory cells, comprising:
    enabling a first word-line selecting module according to a main word-line signal and sequentially selecting a first word line and a second word line by a first word-line driving signal and a second word-line driving signal;

self-refreshing one of the memory cells corresponding to a selected one of the first word line and the second word line, wherein the first main word-line is maintained at the same logic level when the first word line switching to the second word line;

sequentially generating the first word-line driving signal and the second word-line driving signal according to an enable signal and a self-refresh signal and generating a state signal and a refresh signal;

generating a time signal by controlling a time interval between the first word-line driving signal and the second word-line driving signal according to the state signal; and generating the self-refresh signal and the first main word-line signal according to the time signal, wherein the first main word-line signal is maintained at the same logic level before the second word-line driving signal switching to the first word-line driving signal.

6. The memory self-refresh method of claim 5, further comprising:

enabling a second word-line selecting module according to a second main word-line signal and sequentially selecting a third word line and a fourth word line; and self-refreshing one of the memory cells corresponding to the selected one of the third word line and the fourth word line, wherein the second main word-line signal is maintained at the same logic level when the third word line switching to the fourth word line.

7. The memory self-refresh method of claim 5, wherein the first selecting device is a first inverter, the first inverter comprises a first supply source terminal, a first input terminal, and a first output terminal, and the first word-line driving signal is applied to the first inverter by the first input terminal, such that the first inverter selects the first word line by the first output terminal, wherein the second selecting device is a second inverter, the second inverter comprises a second supply source terminal, a second input terminal, and a second output terminal, the second word-line driving signal is applied to the second inverter by the second supply source terminal, and the first main word-line signal selects the second inverter by the second input terminal, such that the second inverter selects the second word line by the second output terminal.

8. The memory self-refresh method of claim 7, further comprising:

generating the first word-line driving signal, the second word-line driving signal, the first main word-line signal, and the refresh signal according to the enable signal generated by a command decoder.

* * * * *